US 8,227,386 B2

(12) United States Patent
Xiao et al.

(10) Patent No.: US 8,227,386 B2
(45) Date of Patent: Jul. 24, 2012

(54) NANOGRAPHENE LAYERS AND PARTICLES AND LUBRICANTS INCORPORATING THE SAME

(75) Inventors: Xingcheng Xiao, Troy, MI (US); Jean M. Dasch, Bloomfield Township, MI (US); Simon Chin-Yu Tung, Rochester Hills, MI (US); Anil K. Sachdev, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 320 days.

(21) Appl. No.: 12/543,418

(22) Filed: Aug. 18, 2009

(65) Prior Publication Data
US 2011/0046026 A1 Feb. 24, 2011

(51) Int. Cl.
*C10M 125/02* (2006.01)
(52) U.S. Cl. .................................... 508/113; 423/448
(58) Field of Classification Search .......... 508/113; 423/448
See application file for complete search history.

(56) References Cited

U.S. PATENT DOCUMENTS

| | | | |
|---|---|---|---|
| 5,164,221 A * | 11/1992 | Someno et al. | 427/575 |
| 6,919,063 B2 | 7/2005 | Jang et al. | |
| 7,071,258 B1 | 7/2006 | Jang et al. | |
| 2005/0108926 A1 * | 5/2005 | Moy et al. | 44/457 |
| 2007/0215253 A1 | 9/2007 | Dasch et al. | |
| 2009/0047520 A1 * | 2/2009 | Lee et al. | 428/408 |

OTHER PUBLICATIONS

Schropp, R. et al., "Hot Wire CVD of Heterogeneous & Polycrystalline Silicon Semicond Thin Films for App in Thin Film Trans & Solar Cells," Mat Phy Mech, (2000), pp. 73-82.
Kim, Keun Soo, et al., "Large-scale pattern growth of graphene films for stretchable transparent electrodes", Nature, vol. 457, Feb. 2009, pp. 706-710.
Qi, Ma, "A study on graphene oxide nanocomposite membrane", with English Abstract, 78 pages.
Miao, Jian-Ying, et al., "Synthesis and properties of carbon nanospheres grown by CVD using Kaolin supported transition metal catalysts", Carbon 42, 2004, pp. 813-822.

* cited by examiner

*Primary Examiner* — Walter D Griffin
*Assistant Examiner* — Taiwo Oladapo
(74) *Attorney, Agent, or Firm* — Dierker & Associates, P.C.

(57) ABSTRACT

A method of making at least one nanographene layer is disclosed herein. The method includes selecting X hydrocarbon precursor and Y hydrogen gas ($H_2$) such that a ratio of X/Y ranges from 0.5 to 1, the hydrocarbon precursor including at least one of $CH_4$, $C_2H_2$ or $C_3H_8$. The method further includes submitting the hydrocarbon precursor to chemical vapor deposition using the hydrogen gas and argon gas (Ar). As a result, i) the hydrocarbon precursor reacts with the hydrogen gas and argon gas (Ar) according to the following reaction:

X hydrocarbon precursor+$YH_2$+ZAr→2X graphene+(Y+2X)$H_2$+ZAr, where Z ranges from 5*(X+Y) to 10*(X+Y), and ii) the hydrocarbon precursor decomposes and self-assembles to form the at least one nanographene layer.

13 Claims, 3 Drawing Sheets

Friction track    Original surface as honed

NANOGRAPHENE LAYERS AND PARTICLES AND LUBRICANTS INCORPORATING THE SAME

TECHNICAL FIELD

The present disclosure relates generally to nanographene layers, nanographene particles and lubricants including nanographene layers or particles.

BACKGROUND

Sliding and movement of parts in manufacturing processes, as well as in powertrain and transmission systems of vehicle engines, are enhanced by paying attention to tribological properties. Conventionally, friction reduction is achieved in machining processes by fully flooding the surface of the machined area with metal working lubricants, which reduce friction and act as coolants. In recent years, machine quality lubrication (MQL) has been used as an alternative to such flooding processes. MQL lubricants usually include a mist of oil-based lubricant in minimum quantity instead of the larger quantities used with conventional machining lubricants.

SUMMARY

A method of making at least one nanographene layer is disclosed herein. The method includes selecting X hydrocarbon precursor and Y hydrogen gas ($H_2$) such that a ratio of X/Y ranges from 0.5 to 1, the hydrocarbon precursor including at least one of $CH_4$, $C_2H_2$ or $C_3H_8$. The method further includes submitting the hydrocarbon precursor to chemical vapor deposition using the hydrogen gas and argon gas (Ar). As a result, i) the hydrocarbon precursor reacts with the hydrogen gas and argon gas (Ar) according to the following reaction:

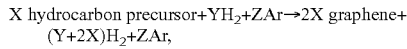

where Z ranges from 5*(X+Y) to 10*(X+Y), and ii) the hydrocarbon precursor decomposes and self-assembles to form the at least one nanographene layer.

BRIEF DESCRIPTION OF THE DRAWINGS

Features and advantages of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Although Minimum Quantity Lubrication (MQL) techniques can be very successful, extreme machining conditions can lead to, among other things, high thermal loads, which cannot be mediated by current MQL lubricants. The present inventors have found that by incorporating nanographene (formed by the embodiments disclosed herein) into such lubricants, many of the negative effects encountered in processes when MQL lubricants are used alone are reduced or eliminated. For example, the nanographene-containing lubricants disclosed herein advantageously reduce the grinding force typically required in processes using standard MQL lubricants (i.e., without nanographene), improve surface roughness and wear resistance of a surface exposed to the lubricant when compared to surfaces exposed to standard MQL lubricants, and reduce or eliminate burning of a workpiece that may otherwise result when standard MQL lubricants are used.

Figure 1:
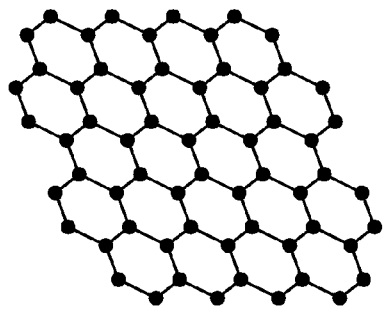
FIG. 1 is a schematic diagram of the chemical structure of a nanographene layer.

Typically, "graphene is the name given to a single layer of carbon atoms densely packed into a benzene-ring structure, and is widely used to describe properties of many carbon-based materials, including graphite, large fullerenes, nanotubes, etc. (e.g., carbon nanotubes are usually thought of as graphene sheets rolled up into nanometer-sized cylinders)." (Novoselov. K. S. et al., "Electric Field Effect in Atomically Thin Carbon Films" Science 306, 666 (2004) doi:10.1126/science.1102896.) A layer of graphene is typically in the form of a single layered sheet having a thickness in the nanometer range. The typical chemical structure of such a graphene layer is depicted in FIG. 1. In particular, this Figure shows the typical nanographene single layer, which includes a series of hexagonal benzene rings interconnected in a single layer.

In an embodiment of the method disclosed herein, at least one nanographene layer is formed by submitting gaseous hydrocarbon precursors to chemical vapor deposition. Very generally, during the deposition process, the hydrocarbon precursor(s) decompose and self-assemble to form the nanographene layer. The reaction between the hydrocarbon precursor and other gases is in accordance with the following chemical equation:

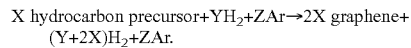

It is to be understood that the selection of the ratio of hydrocarbon precursor to hydrogen gas will affect the formation of the nanographene. In an embodiment, the ratio of X/Y ranges from 0.5 to 1, and Z ranges from 5*(X+Y) to 10*(X+Y). Selecting amounts of the precursor and other gases within these ranges enables the hydrocarbon precursor to decompose and self-assemble to form the at least one nanographene layer.

In an embodiment, the precursors react and/or decompose on the surface of the CVD chamber or on a substrate surface, thus producing a desired layer or layers of nanographene. It is to be understood that, in embodiment(s) disclosed herein, nanographene particles may be made from a single layer or multiple layers of the nanographene. The amount of time used in the deposition process is one factor in determining how many nanographene particles can be obtained. Furthermore, a higher flow ratio of carbon-containing precursor and a lower growth temperature leads to more layers of graphene basal planes being produced in one single particle. In fact, the graphene products formed from the deposition process disclosed herein are all graphene layers in some form. Some of the graphene layers have become curved or bent (described further hereinbelow), and thus have a particle-like shape. These nanographene particles can be analogized to a crumpled piece of paper, which though originally shaped like a flat layer, becomes shaped like a ball when crumpled.

It is to be understood that if volatile byproducts are produced along with the nanographene layer(s), such by-products may flow away from the nanographene layer as gas flows through the reaction chamber. In an embodiment, one of the by-products may be additional hydrogen gas which forms from the decomposed hydrocarbons (non-limiting examples of which include $CH_4$, $C_2H_2$ and $C_3H_8$).

In one embodiment, the nanographene layers are produced in using microwave plasma enhanced CVD deposition process. In this variation of CVD, plasma is used to enhance the rates of chemical reaction of the precursors. This enhanced reaction rate allows the deposition to take place at lower temperatures.

In another embodiment, such nanographene layers are produced by hot filament chemical vapor deposition. In this variation of CVD, a hot filament or wire is used to assist in the chemical decomposition of the source gases.

In still another embodiment, and as alluded to above, the at least one nanographene layer is deposited on a substrate surface. It is to be understood that any suitable substrate may be used that is stable up to about 900° C. (i.e., the maximum processing temperature for the CVD processes used). It is to be further understood that the substrate functions to collect the nanographene particles/layers during deposition, and thus any suitable substrate may be used. Non-limiting examples of such substrates include silica wafers, stainless steel substrates, and nickel substrates.

In an embodiment, the resulting nanographene layer(s) may be formed into particles by self curving the nanographene layers. This may be accomplished by increasing the argon gas flow ratio and decreasing the hydrogen gas flow ratio. Generally, the edges of the graphene basal planes have many dangling bonds which are thermodynamically unstable. The adjustment of the Ar and $H_2$ flow ratio causes the basal plane to bend itself so that the dangling bonds can connect to each other to form C—C bonds. This bending of the nanographene layer(s) leads to the formation of particle (s).

The nanographene layer(s) and particles formed via chemical vapor deposition may be dispersed into lubricants for use in a variety of industrial applications. It is to be understood that either the layers themselves or the particles obtained from the layers may be incorporated into a desirable lubricant. It is believed that the morphology of the layers or particles does not change after being added to the lubricant. The amount of nanographene dispersed in the lubricant ranges from about 0.05 weight percent to about 5 weight percent. In another embodiment, the nanographene is present in an amount ranging from about 0.5 weight percent to about 1 weight percent. When amounts are referred to as being about a particular weight percent, the about generally includes ±0.1 weight percent. Non-limiting examples of such lubricants include MQL lubricants, coolants, driveline lubricants, powertrain lubricants, etc. In one example, the lubricants are vegetable fatty alcohols, vegetable fatty acids or combinations thereof.

In another example, the lubricant is Acculube®-LB-2000. In yet another example, the lubricant is Shell® Oil Lubricant SAE 5W-30 SG grade.

The properties of the graphene enable the layer(s) and/or particles to be included and suitably dispersed in such lubricants without the use of additional dispersants or solvents. It is theorized that the nanographene disperses in the lubricant without additional dispersants or solvents because the interaction between the pi bonds on the nanographene particles or nanographene layers and the functional groups in the fatty alcohols and fatty acids in the lubricants enables the dispersion to readily take place.

The nanographene layer/particles formed via the method disclosed herein has a Young's Modulus ranging from 0.9 to 1.2 TPa, a fracture strength ranging from 90 to 150 GPa, and a thermal conductivity ranging from $4.84 \times 10^3$ to $5.30 \times 10^3$ $Wm^{-1}$ at $K^{-1}$. In another embodiment, the nanographene layer/particles may have a thermal conductivity of up to $3.0 \times 10^3$ $Wm^{-1}$ at $K^{-1}$.

The nanographene particles formed from the nanographene layer(s) exhibit the same properties as the layers, including, for example, the high thermal conductivity (up to ~5,300 $Wm^{-1}$ at $K^{-1}$) and the excellent mechanical properties set forth above. In one example, the individual particles have a thermal conductivity of up to 5300 $Wm^{-1}$ at $K^{-1}$ for a specific surface area of up to about 3,000 $m^2/g$ (e.g., 2,675 $m^2/g$).

It is believed that the chemical vapor deposition process used contributes to the existence of these enhanced properties in the nanographene particles/layers. The properties discussed above, which are exhibited by the nanographene layer (s) and particles, can enhance the industrial applications in which they are used. By including the nanographene layer(s) (or particles formed therefrom) in lubricants, the desirable properties of the nanographene are also exhibited by the lubricant. As a result, the tribological performance and/or tool durability may be improved in applications in which the lubricant including the nanographene is used. In fact, as shown in the examples hereinbelow, benchtop tribological tests have shown significantly improved tribological performance and tool durability using MQL lubricant with nanographene particles (formed via the method disclosed herein) added, when compared to conventional metal working lubricants (not including such nanographene). For example, using the lubricants having the nanographene particles/layers therein may reduce at least one of friction and wear. Furthermore, using the lubricants having the particles/layers therein can also improve thermal conductivity of the surface to which the lubricant is applied.

When the nanographene layer(s) and/or particles are blended as an additive into other coolants or driveline lubricants, it is believed that cooling efficiency and tribological performance can be enhanced when such fluids are used in the engine, transmission and/or driveline. Based on the lower friction and wear properties, the nanographene particles disclosed herein can also be added into conventional powertrain lubricants for reducing friction and wear in chassis and driveline systems.

To further illustrate embodiment(s) of the present disclosure, the following examples are given. It is to be understood that these examples are provided for illustrative purposes and are not to be construed as limiting the scope of embodiment(s) of the present disclosure.

EXAMPLES

Example 1

Figure 2A:
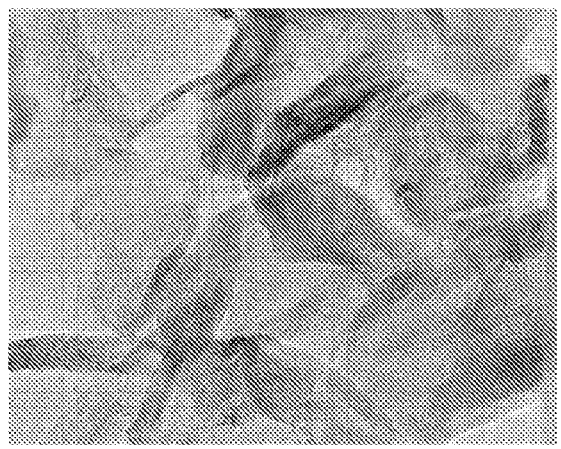
FIGS. 2A and 2B are transmission electron micrographs showing layers of nanographene formed by the method(s) disclosed herein.
Figure 2B:
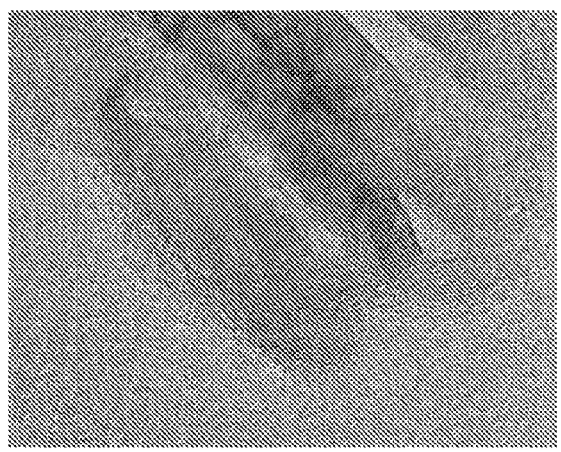

Nanographene layered particles were produced in a microwave plasma enhanced CVD deposition process. In the CVD process, $C_2H_2$ was applied at 40 standard cubic centimeters per minute (sccm), $H_2$ at 80 sccm and Ar at 300 sccm. The temperature of the process was around 300° C. FIGS. 2A and 2B show transmission electron micrographs of layers of nanographene formed by the above-described microwave plasma enhanced CVD deposition process. FIG. 2A has a print magnification of 863,000 at 7 inches and FIG. 2B has a print magnification of 3,450,000 at 7 inches.

Figure 3A:
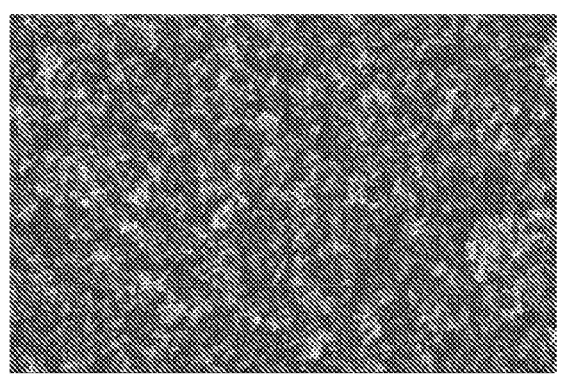
FIGS. 3A and 3B are scanning electron micrographs showing layers of nanographene formed by the method(s) disclosed herein.
Figure 3B:
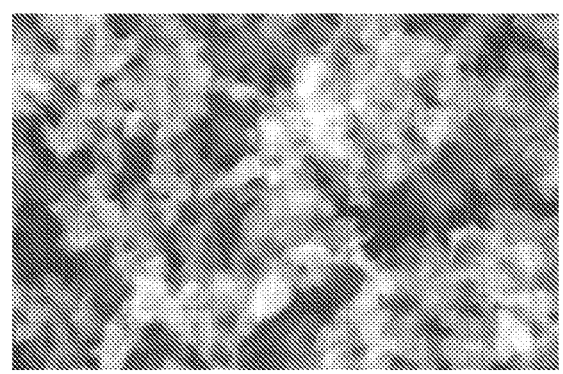

FIGS. 3A and 3B show scanning electron micrographs of the layers of nanographene formed by the previously described microwave plasma enhanced CVD deposition process. FIG. 3A shows the layers at a magnification of 25,000× and FIG. 3B shows layers at a magnification of 100,000×.

Example 2

Particles from the nanographene layers formed in Example 1 were then dispersed in an MQL lubricant, Accu-Lube® LB-2000 (ITW Rocol® North America). One example lubricant included 1 weight % of the nanographene particles and another example lubricant included 0.2 weight % of the nanographene particles. Benchtop tribological tests showed significantly improved tribological performance and tool durability using the MQL lubricant with the nanographene dispersed therein as compared to the conventional metal working lubricants without nanographene. As a comparative example, the MQL lubricant without nanographene (i.e., 0 wt % nanographene particles) was also subjected to such tests.

Figure 4:
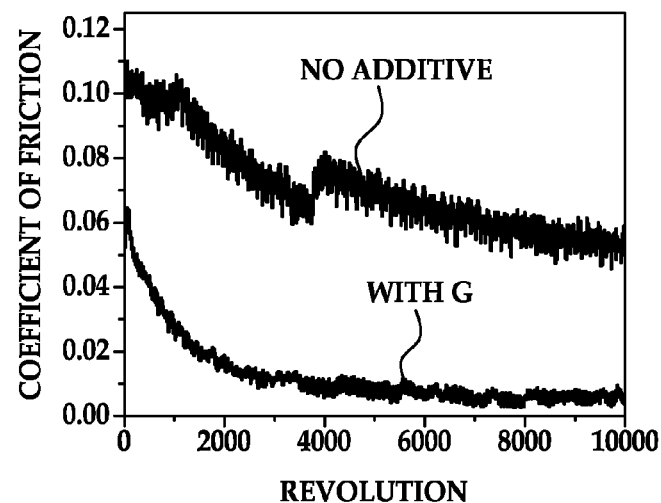
FIG. 4 is a graph plotting coefficient of friction (y axis) against revolutions (x axis) for a lubricant including the nanographene particles disclosed herein and a lubricant not including the nanographene particles disclosed herein.

One set of experiments was conducted using an Al319 aluminum alloy pin rubbing against a nanocrystalline diamond coated tool material. The coefficient of friction was measured as a function of number of revolutions of the pin when the above-described MQL lubricant (Accu-Lube® LB-2000) with nanographene (1 weight %) was included and when the MQL lubricant (Accu-Lube® LB-2000) without nanographene was included. FIG. 4 is a graph of the data obtained from these experiments. Specifically, FIG. 4 plots the coefficient of friction (y axis) against the revolutions (x axis). As depicted, the coefficient of friction is decreased when the nanographene is included in the lubricant.

Example 3

Figure 5:
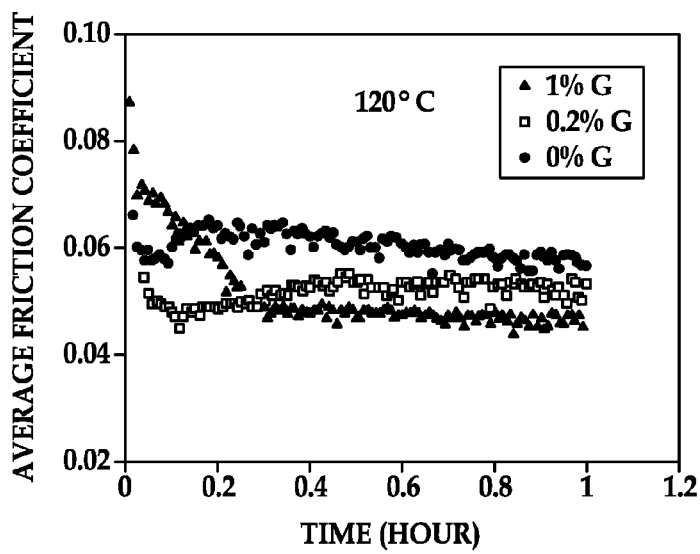
FIG. 5 is a graph plotting average friction coefficient (y axis) against time (hours) (x axis) for lubricants including varying amounts of the nanographene particles disclosed herein.

Another set of experiments was conducted with a cast iron cylinder bore rubbing against a piston ring. This time the tests were run using Shell® Oil Lubricant SAE 5W-30 SG grade as the MQL lubricant. Comparative tests were thus conducted with the MQL lubricant (i.e., Shell® Oil Lubricant SAE 5W-30 SG grade) having nanographene therein and the same kind of MQL lubricant (Shell® Oil Lubricant SAE 5W-30 SG grade) without nanographene therein. The average friction coefficient was measured as a function of time for the MQL lubricant with 1 wt % nanographene, the MQL lubricant with 0.2 wt % graphene and a MQL lubricant with 0% graphene. FIG. 5 is a graph of the data obtained from these experiments. Specifically, FIG. 5 plots the average friction coefficient (y axis) against time (in hours, shown along the x axis). As depicted, the coefficient of friction was lower over time for the lubricant with nanographene than the comparative example lubricant with no nanographene.

Figures 6A, 6B:
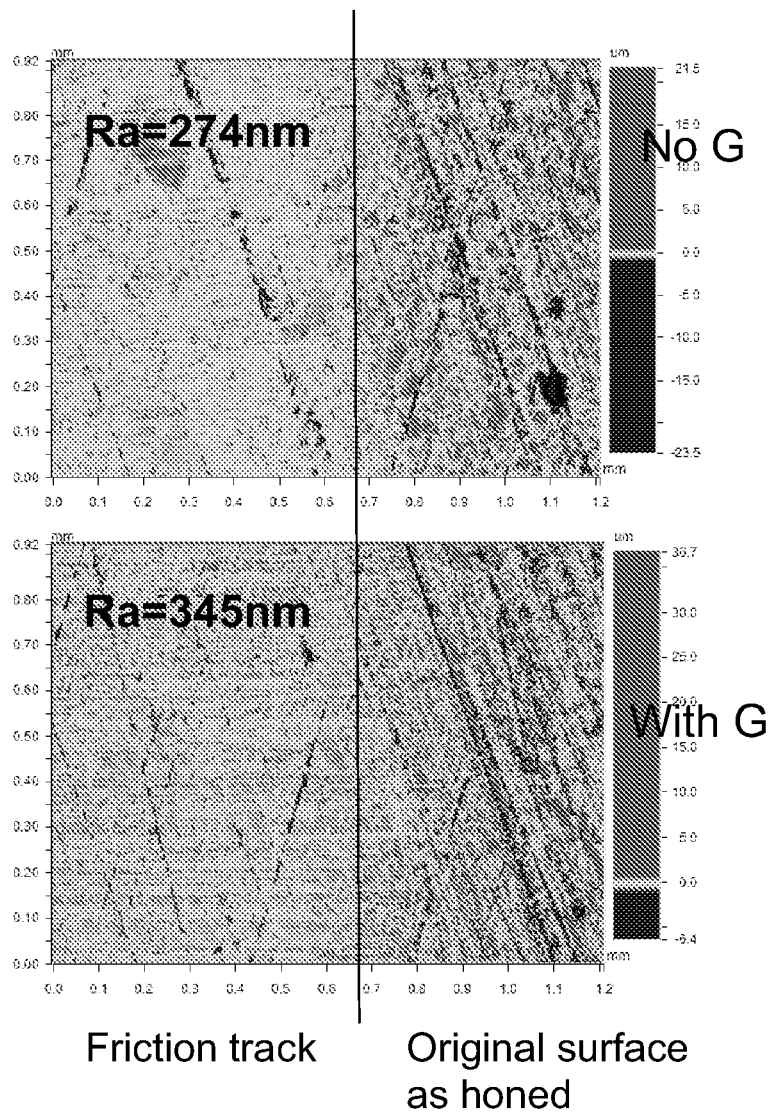
FIGS. 6A and 6B show "friction track" graphs for a lubricant having none of the nanographene particles disclosed herein (FIG. 6A) and for a lubricant including the nanographene particles disclosed herein (FIG. 6B).

FIGS. 6A and 6B show "friction track" graphs for, respectively, the 0 wt % nanographene lubricant lubricated bore and the 1 wt % nanographene lubricant lubricated bore described above in reference to the graph in FIG. 5. In both FIGS. 6A and 6B, the tested area, having been submitted to the rubbing test plotted in the graph in FIG. 5, is the "friction track" on the left side of the black line. In both FIGS. 6A and 6B, the original area before testing is designated as the "original surface as honed." Different surface heights on the "friction graphs" are indicated as one of three colors: red, green and blue. The specific height ranges measured in μm are indicated in the color scale (with segments of red, green and blue) on the right of each "friction track" graph in FIGS. 6A and 6B. FIG. 6A shows the before testing and after testing results using the lubricant without nanographene particles. In contrast, FIG. 6B shows the before testing and after testing results using the lubricant with nanographene particles. $R_a$ as shown in both Figures indicates degree of roughness for the friction track surfaces. It can be seen that the $R_a$ number (and the overall surface height in μm in terms of the color scale on the right of each graph) is higher for the FIG. 6B "friction track" ($R_a$=345 nm) than for the FIG. 6A "friction track" ($R_a$=274 nm). This indicates that rubbing the surface with lubricant having the nanographene particles therein resulted in less material on the surface being worn down during the rubbing test. The different colors (red, green and blue) indicate different levels of surface height.

While several embodiments have been described in detail, it will be apparent to those skilled in the art that the disclosed embodiments may be modified. Therefore, the foregoing description is to be considered exemplary rather than limiting.

The invention claimed is:

1. A method of making nanographene particles from at least one nanographene layer, the method comprising:
   selecting X hydrocarbon precursor and Y hydrogen gas ($H_2$) such that a ratio of X/Y ranges from 0.5 to 1, the hydrocarbon precursor including at least one of $CH_4$, $C_2H_2$ or $C_3H_8$;
   submitting the hydrocarbon precursor to chemical vapor deposition using the hydrogen gas and argon gas (Ar), whereby i) the hydrocarbon precursor reacts with the hydrogen gas and argon gas (Ar) according to the following reaction:

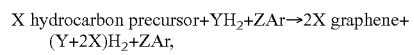

X hydrocarbon precursor+$YH_2$+ZAr→2X graphene+ (Y+2X)$H_2$+ZAr, where Z ranges from 5*(X+Y) to 10*(X+Y), and ii) the hydrocarbon precursor decomposes and self-assembles to form the at least one nanographene layer; and
   while submitting the hydrogen precursor to the chemical vapor deposition, self-curving the at least one nanographene layer by adjusting a flow ratio of the argon gas (Ar) to the hydrogen gas so that argon gas flow increases and hydrogen gas flow decreases, thereby causing the at least one nanographene layer to bend itself to connect thermodynamically unstable dangling bonds on a surface thereof to form C—C bonds, and to form the nanographene particles.

2. The method of claim 1 wherein the at least one nanographene layer is deposited on, and the nanographene particles are formed on a surface of a substrate positioned in a chemical vapor deposition chamber used to perform the chemical vapor deposition, wherein the substrate is chosen from silica, stainless steel, and nickel.

3. The method of claim 2 wherein the substrate is stable up to at least 900° C.

4. The method of claim 1 wherein the chemical vapor deposition is plasma enhanced chemical vapor deposition, hot filament chemical vapor deposition, or combinations thereof.

5. The method of claim 1 wherein the nanographene particles have a Young's Modulus ranging from 0.9 to 1.2 TPa, a fracture strength ranging from 90 to 150 GPa, and a thermal conductivity ranging from $4.84 \times 10^3$ to $5.30 \times 10^3$ $Wm^{-1}$ at $K^{-1}$.

6. Nanographene particles made by the method of claim 1 wherein each of the nanographene particles has thermal conductivity up to 5300 $Wm^{-1}$ at $K^{-1}$ and a specific surface area up to 2,675 $m^2/g$.

7. A method of making a lubricant for use in industrial applications, the method comprising:

selecting X hydrocarbon precursor and Y hydrogen gas ($H_2$) such that a ratio of X/Y ranges from 0.5 to 1, the hydrocarbon precursor including at least one of $CH_4$, $C_2H_2$ or $C_3H_8$;

submitting the hydrocarbon precursor to chemical vapor deposition using the hydrogen gas and argon gas (Ar), whereby i) the hydrocarbon precursor reacts with the hydrogen gas and argon gas (Ar) according to the following reaction:

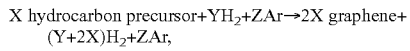
X hydrocarbon precursor+$YH_2$+ZAr→2X graphene+ (Y+2X)$H_2$+ZAr, where Z ranges from 5*(X+Y) to 10*(X+Y), and ii) the hydrocarbon precursor decomposes and self-assembles to form the at least one nanographene layer;

while submitting the hydrogen precursor to the chemical vapor deposition, self-curving the at least one nanographene layer by adjusting a flow ratio of the argon gas (Ar) to the hydrogen gas so that argon gas flow increases and hydrogen gas flow decreases, thereby causing the at least one nanographene layer to bend itself to connect thermodynamically unstable dangling bonds on a surface thereof to form C—C bonds, and to form the nanographene particles; and dispersing the nanographene particles into a lubricant.

8. The method of claim 7 wherein the nanographene particles are present in the lubricant in an amount ranging from about 0.05 weight percent to about 5 weight percent.

9. The method of claim 7 wherein the nanographene particles are present in the lubricant in an amount ranging from about 0.5 weight percent to about 1 weight percent.

10. The method of claim 7 wherein the chemical vapor deposition is plasma enhanced chemical vapor deposition, hot filament chemical vapor deposition, or combinations thereof.

11. The method of claim 7 wherein the lubricant is an MQL lubricant selected from the group consisting of vegetable fatty alcohols, vegetable esters, and combinations thereof.

12. The method of claim 7 wherein adjusting the flow ratio of argon gas to hydrogen gas includes increasing the argon gas flow and decreasing the hydrogen gas flow.

13. An industrial lubricant made by the method of claim 7.

* * * * *